(12) United States Patent
Anderson et al.

(10) Patent No.: US 9,991,354 B2
(45) Date of Patent: Jun. 5, 2018

(54) METAL NITRIDE ALLOY CONTACT FOR SEMICONDUCTOR

(71) Applicant: The United States of America, as represented by the Secretary of the Navy, Washington, DC (US)

(72) Inventors: Travis J. Anderson, Alexandria, VA (US); Virginia D. Wheeler, Alexandria, VA (US); David Shahin, Springfield, VA (US); Andrew D. Koehler, Alexandria, VA (US); Karl D. Hobart, Alexandria, VA (US); Francis J. Kub, Arnold, MD (US); Marko J. Tadjer, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days. days.

(21) Appl. No.: 15/596,933

(22) Filed: May 16, 2017

(65) Prior Publication Data

US 2017/0330950 A1    Nov. 16, 2017

Related U.S. Application Data

(60) Provisional application No. 62/337,028, filed on May 16, 2016, provisional application No. 62/337,015, filed on May 16, 2016.

(51) Int. Cl.
| | |
|---|---|
| *H01L 29/205* | (2006.01) |
| *H01L 29/47* | (2006.01) |
| *H01L 29/20* | (2006.01) |
| *H01L 29/40* | (2006.01) |

(Continued)

(52) U.S. Cl.
CPC ........ *H01L 29/475* (2013.01); *H01L 29/2003* (2013.01); *H01L 29/205* (2013.01); *H01L 29/401* (2013.01); *H01L 29/778* (2013.01); *H01L 29/872* (2013.01)

(58) Field of Classification Search
CPC ... H01L 29/475; H01L 29/401; H01L 29/872; H01L 29/205; H01L 29/2003; H01L 29/778
See application file for complete search history.

(56) References Cited

U.S. PATENT DOCUMENTS

| | | |
|---|---|---|
| 5,298,784 A | 3/1994 | Gambino et al. |
| 6,262,460 B1 | 7/2001 | Kalnitsky et al. |

(Continued)

OTHER PUBLICATIONS

International Search Report and Written Opinion for PCT/US2017/032927 from the International Searching Authority, dated Jul. 27, 2017.

*Primary Examiner* — Selim Ahmed
(74) *Attorney, Agent, or Firm* — US Naval Research Laboratory; William P. Ladd

(57) ABSTRACT

Systems and methods are provided that enable the production of semiconductor devices having a metal nitride layer in direct contact with a semiconductor layer to form a Schottky diode, such as a TiN gate on an AlGaN/GaN high electron mobility transistor (HEMT). Metal nitrides offer exceptional thermal stability and a lower diffusion coefficient. Technology enabled by embodiments of the present disclosure improves the reliability of GaN-based microwave power transistors.

20 Claims, 13 Drawing Sheets

(51) Int. Cl.
*H01L 29/778* (2006.01)
*H01L 29/872* (2006.01)

(56) References Cited

U.S. PATENT DOCUMENTS

| | | | |
|---|---|---|---|
| 2009/0090938 A1* | 4/2009 | Luo | H01L 21/265 |
| | | | 257/288 |
| 2011/0227089 A1 | 9/2011 | Mieczkowski et al. | |
| 2012/0214294 A1* | 8/2012 | Kon | C11D 7/5013 |
| | | | 438/478 |
| 2013/0092958 A1* | 4/2013 | Chen | H01L 29/2003 |
| | | | 257/77 |
| 2013/0264576 A1* | 10/2013 | Onizawa | H01L 21/02345 |
| | | | 257/76 |
| 2014/0264454 A1* | 9/2014 | Banerjee | H01L 29/7786 |
| | | | 257/194 |
| 2015/0102360 A1 | 4/2015 | Alvarez et al. | |
| 2015/0145004 A1* | 5/2015 | Inoue | H01L 29/4236 |
| | | | 257/192 |
| 2015/0357457 A1 | 12/2015 | Ritenour | |

* cited by examiner

TABLE I
DEVICE PARAMETERS FOR NI/AU-, TIN-, AND NCD GATED HEMTS

| Parameter | Units | Gate Material | | |
|---|---|---|---|---|
| | | Ni/Au | TiN | NCD |
| $V_t$ | V | -2.47 | -2.77 | -2.98 |
| $I_{off}$ ($V_{gs}$ = -10V) | mA/mm | 0.179 | 4.88 | 0.448 |
| $g_{m,max}$ | mS/mm | 140 | 159 | 101 |
| $I_{ds,max}$ ($V_{gs}$ = 1V) | mA/mm | 491 | 589 | 413 |
| $R_{on}$ | Ω·mm | 8.61 | 8.10 | 18.1 |
| $n_s$ | cm$^{-2}$ | 6.76×10$^{12}$ | 7.75×10$^{12}$ | <1×10$^{12}$ |
| $\mu_{2DEG}$ | cm$^2$/(V·sec) | 1890 | 1950 | n/a |

FIG. 3

Table II

Breakdown Voltages for Ni/Au- and TiN- Gated HEMTs

| Gate | Reverse Breakdown Voltage (V) | |
|---|---|---|
| | Individual | Average (Nearest 10V) |
| Ni/Au | -220, -250, -210, -280, -270, -250, -270, -270, -270, -270 | -240 ± 30 V |
| TiN | | -270 ± 10 V |

FIG. 5

METAL NITRIDE ALLOY CONTACT FOR SEMICONDUCTOR

CROSS REFERENCE TO RELATED APPLICATIONS

This application claims the benefit of U.S. Provisional Patent Application No. 62/337,015, filed on May 16, 2016, and U.S. Provisional Patent Application No. 62/337,028, filed on May 16, 2016, both of which are incorporated by reference herein in their entireties.

FIELD OF THE DISCLOSURE

This disclosure relates to semiconductors, including Group III-nitride based high electron mobility transistors (HEMTs).

BACKGROUND

Group III-nitride based high electron mobility transistors (HEMTs) are attracting significant interest (e.g., for microwave and power switching applications). Electrically and thermally stable device schemes are essential for reaching the maximum potential of GaN devices. The reliability of Ni/Au-based Schottky gate metallizations has been limited by gate degradation from Ni migration into nearby metal and semiconductor layers when subjected to electrical and thermal stress. As such, development of alternative gate schemes resistant to these degradation mechanisms is highly desirable for fabrication of reliable HEMTs.

In conventional devices, nickel metal is in direct contact with III-nitride alloy material, such as gallium nitride. The nickel metal layer typically has a gold metal top layer. The nickel atoms are known to diffuse into the gallium nitride III-Nitride material with thermal stress, causing degraded Schottky to III-Nitride junction reliability, which is undesirable.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 3 is a table (Table I) showing parameters devices listed in Table I in accordance with an embodiment of the present disclosure;

FIG. 5 is a table (Table II) showing breakdown voltages for Ni/Au- and Ti/N-gated HEMTs in accordance with an embodiment of the present disclosure;

Figure 1A:
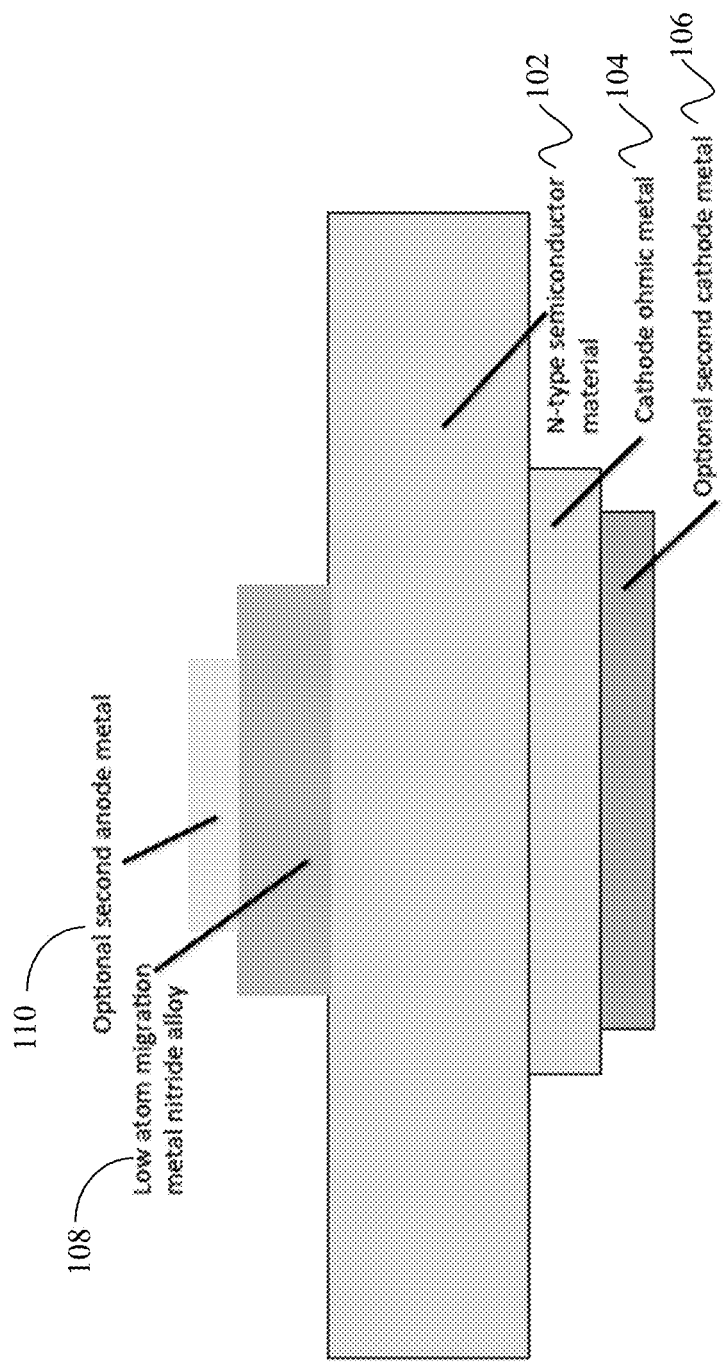
FIG. 1A is a cross-section of a low atom migration metal nitride alloy material layer diode on III-Nitride material in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. OVERVIEW

In a first embodiment, this disclosure describes a low atom migration (diffusion) metal nitride alloy (e.g., titanium nitride) material layer to a III-Nitride device that comprises a metal nitride alloy material layer having a first surface and a second surface, with the second surface in direct atomic contact with the III-Nitride surface, wherein the atoms comprising the metal nitride alloy material layer have low migration (low diffusion) into the III-Nitride material, and the atoms comprising the III-Nitride have low migration into the metal nitride alloy material layer (during storage or under stress).

In a second embodiment, this disclosure describes a low atom migration (diffusion) composite metal nitride alloy material layer to semiconductor device that comprises a high work function metal nitride alloy material layer having a first surface and a second surface with the second surface in direct atomic contact with the semiconductor surface and a second metal nitride alloy material layer with a first and second surface with the second surface in direct contact with the first surface of the high work function metal nitride alloy material layer, wherein the atoms comprising the metal nitride alloy material layer have low migration (low diffusion) into the semiconductor material, and the atoms comprising the semiconductor have low migration into the metal nitride alloy material layer (during storage or under stress).

In a third embodiment, this disclosure describes a low atom migration (diffusion) metal nitride alloy material layer to semiconductor device that comprises one or more than one tunneling material layer(s) at the interface between the metal nitride alloy material layer and the semiconductor, wherein the atoms comprising the metal nitride alloy material layer have low migration (low diffusion) into the semiconductor material, and the atoms comprising the semiconductor have low migration into the metal nitride alloy material layer (during storage or under stress).

In a first exemplary method, the low atom migration metal nitride alloy material layer may be deposited by atomic layer deposition. In a second exemplary method, the low atom migration metal nitride alloy material layer may be deposited by a non-plasma process metal which may include atomic layer deposition, metal organic chemical vapor deposition, chemical vapor deposition, or molecular beam deposition.

2. EXEMPLARY DEVICES

AlGaN/GaN high electron mobility transistors (HEMTs) commonly rely on Ni/Au-based Schottky gate metallizations that have been shown to degrade when subjected to electrical stress, thermal stress, and radiation due to Ni migration into adjacent metal or semiconductor layers. The instability of these Ni-based gates limits device reliability, rendering the search for alternative gate materials that are electrically and thermally stable a topic of tremendous importance.

Materials such as the transition metal nitrides (TiN, etc.) and boron-doped nanocrystalline diamond represent candidate materials for replacement of the Ni-based gates. Of the transition metal nitrides, TiN is a particularly promising material, due to its near-metallic conductivity, suitable Schottky barrier heights and ideality factors on GaN and AlGaN, and high temperature stability. These nitrides can be easily deposited by atomic layer deposition (ALD), sputtering, or molecular beam epitaxy (MBE), which is particularly attractive due to the ability to deposit in-situ immediately after the AlGaN/GaN growth without exposing the material to atmosphere, thereby further improving device quality and reliability. Boron-doped p+ diamond gates have also been shown to be candidates for HEMT gates and are attractive due to the high thermal conductivity and low leakage in the heterojunction gate. Though these materials show promise for HEMT gates, little work has been done to assess their contributions to device reliability under extended electrical or thermal stress.

Conventional Ni/Au metallization fails in GaN devices due to diffusion. Metal Schottky gate contacts often fail due to metal diffusion into the semiconductor. Transition metal nitrides offer low sheet resistance and suitable work function to behave as Schottky gate electrodes in GaN transistor structures. The use of metal nitride electrodes mitigates the diffusion failure mechanism for improved reliability, resulting in significantly higher breakdown voltage and thermal stability.

Embodiments of the present disclosure provide semiconductor devices having a metal nitride layer in direct contact with a semiconductor layer to form a Schottky diode, such as a TiN gate on an AlGaN/GaN HEMT. Embodiments of the present disclosure provide transistors (i.e., AlGaN/GaN HEMT) with a metal nitride gate (i.e. TiN) and semiconductor Schottky diodes with a metal nitride electrode.

Embodiments of the present disclosure provide systems and methods including TiN-based Schottky contacts to GaN devices, as opposed to a use as ohmic contacts or diffusion barriers. In accordance with embodiments of the present disclosure, the films can be deposited using conventional thin film growth techniques such as ALD, which are compatible with semiconductor fabrication processes. Metal nitrides offer exceptional thermal stability and lower diffusion coefficient. Technology enabled by embodiments of the present disclosure will improve the reliability of the GaN-based microwave power transistor.

Figure 1B:
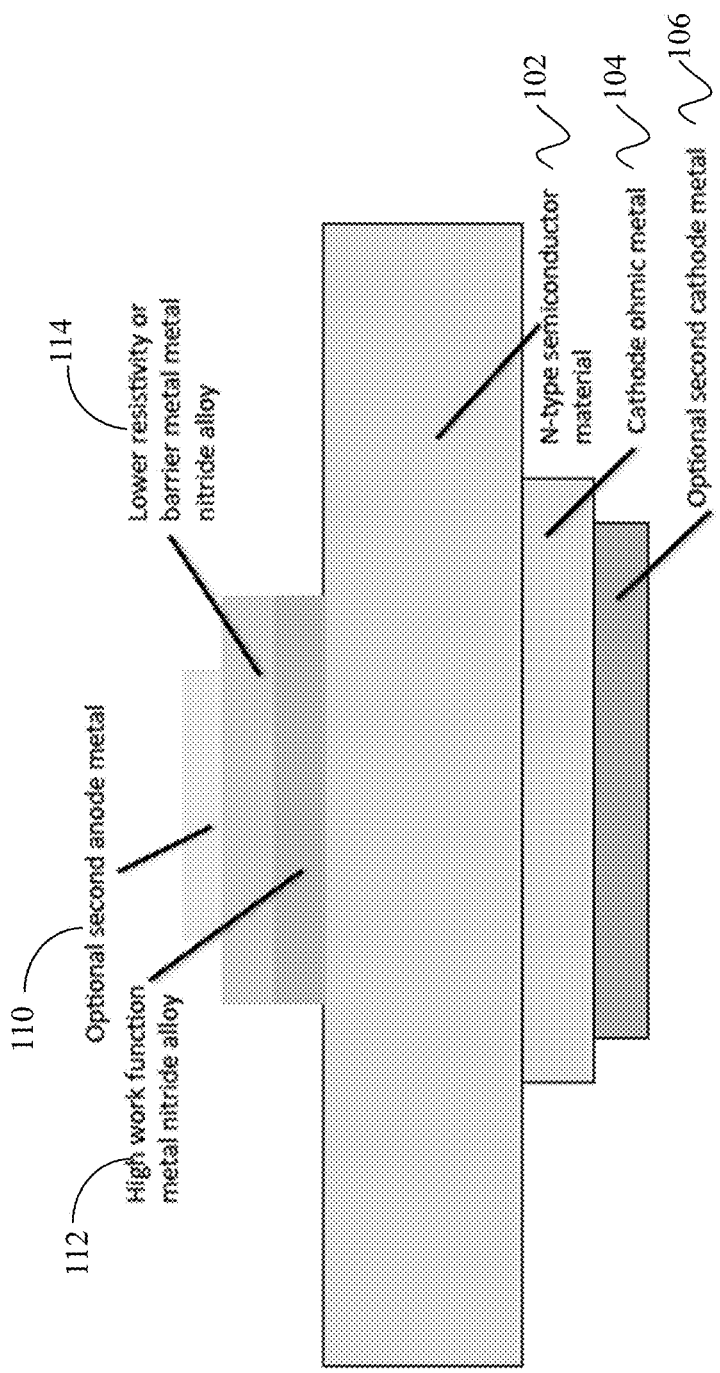
FIG. 1B is a cross-section of a low atom migration metal nitride alloy material layer diode on III-Nitride material including a high work function metal nitride alloy in accordance with an embodiment of the present disclosure.
Figure 1C:
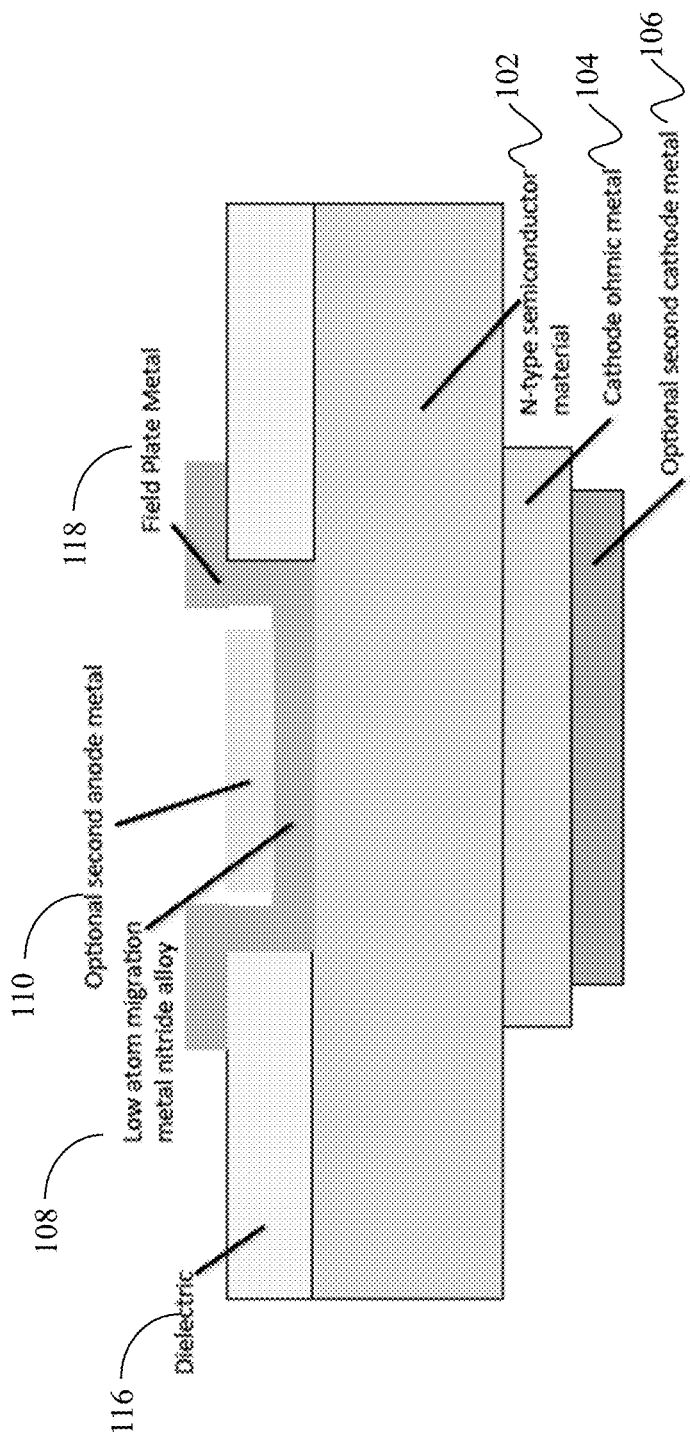
FIG. 1C is a cross-section of a low atom migration metal nitride alloy material layer diode including a dielectric and field plate in accordance with an embodiment of the present disclosure.
Figure 1D:
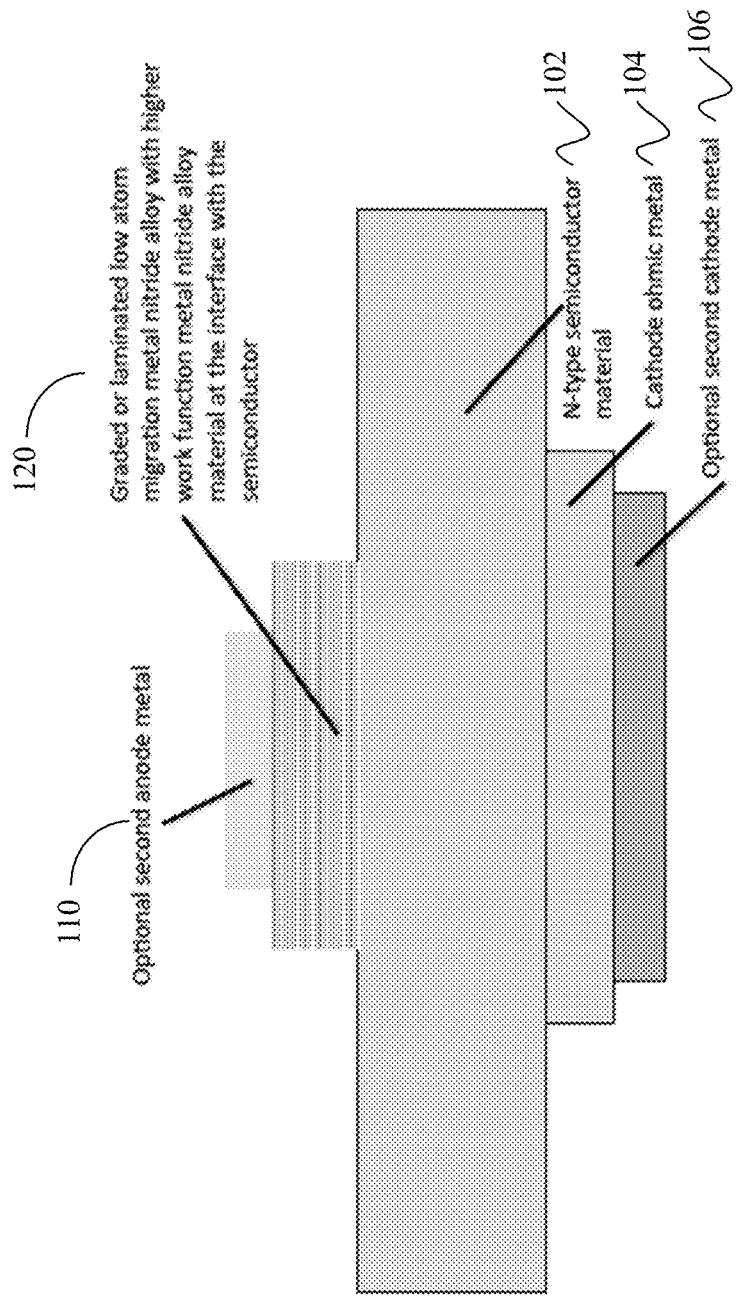
FIG. 1D is a cross-section of a low atom migration metal nitride alloy material layer diode including a vertically graded low atom migration metal nitride alloy material layer in accordance with an embodiment of the present disclosure.

2.1. Two Terminal Device with Electrical Stability for Metal Nitride Alloy Electrode FIG. 1A is a cross-section of a low atom migration metal nitride alloy material layer diode on III-Nitride material in accordance with an embodiment of the present disclosure. In an embodiment, the low atom migration metal nitride alloy material layer diode of FIG. 1A is a Schottky diode. FIGS. 1B-1D are additional embodiments of cross-sections of a low atom migration metal nitride alloy material layer diode on III-Nitride material in accordance with embodiments of the present disclosure. Specifically, FIG. 1B is a cross-section of a low atom migration metal nitride alloy material layer diode on III-Nitride material including a high work function metal nitride alloy in accordance with an embodiment of the present disclosure. FIG. 1C is a cross-section of a low atom migration metal nitride alloy material layer diode including a dielectric 116 and field plate 118 in accordance with an embodiment of the present disclosure. FIG. 1D is a cross-section of a low atom migration metal nitride alloy material layer diode including a vertically graded low atom migration metal nitride alloy material layer 120 in accordance with an embodiment of the present disclosure.

FIG. 1A includes N-type semiconductor material 102 and cathode ohmic metal 104. FIG. 1A also includes optional second cathode metal 106 and optional second anode metal 110. As shown in FIG. 1A, low atom migration metal nitride alloy material layer 108 is deposited on N-type semiconductor material 102. In an embodiment, low atom migration metal nitride alloy material layer 108 has a layer that is in direct atomic contact with the III-Nitride surface of N-type semiconductor material 102. In an embodiment, the atoms comprising low atom migration metal nitride alloy material layer 108 have low migration (low diffusion) into the III-Nitride material of N-type semiconductor material 102, and the atoms comprising the III-Nitride material of N-type semiconductor material 102 have low migration into low atom migration metal nitride alloy material layer 108 (during storage or under stress).

As discussed above, in an embodiment, low atom migration (diffusion) metal nitride alloy material layer 108 to a III-Nitride device may be a two terminal device which may include, but not be limited, to a Schottky diode, a junction barrier Schottky (JBS) diode, or a merged PIN Schottky diode. Low atom migration metal nitride alloy material layer 108 may have a reverse voltage in the range of 0.2V to 50 kV. In some embodiments, low atom migration metal nitride alloy material layer 108 has low atom diffusion in III-nitride alloy material for reverse voltages in the range of about 0.1V to about 5 volts. In some embodiments, low atom migration metal nitride alloy material layer 108 may have low atom diffusion in III-nitride alloy material for two terminal devices for reverse voltages to about 30 volts. In some embodiments, low atom migration metal nitride alloy material layer 108 has low atom diffusion in III-nitride alloy material for two terminal devices for reverse voltages to about 100 volts. In some embodiments, low atom migration metal nitride alloy material layer 108 has low atom diffusion in III-nitride alloy material for two terminal devices for reverse voltages to about 200 volts.

In some embodiments, low atom migration metal nitride alloy material layer 108 has low atom diffusion in III-nitride alloy material for two terminal devices for reverse voltages to about 600 volts. In some embodiments, low atom migration metal nitride alloy material layer 108 has low atom diffusion in III-nitride alloy material for two terminal devices for reverse voltages to about 1200 volts. In some embodiments, low atom migration metal nitride alloy material layer 108 has low atom diffusion in III-nitride alloy material for two terminal devices for reverse voltages to about 3300 volts. In some embodiments, low atom migration metal nitride alloy material layer 108 has low atom diffusion in III-nitride alloy material for two terminal devices to about 6500 volts. In some embodiments, low atom migration metal nitride alloy material layer 108 has low atom diffusion in III-nitride alloy material for two terminal devices for reverse voltages to about 10000 volts. In some embodiments, low atom migration metal nitride alloy material layer 108 has low atom diffusion in III-nitride alloy material for two terminal devices for reverse voltages 15000 volts.

2.2. Three Terminal Devices

In an embodiment, low atom migration metal nitride alloy material layer 108 may comprise the gate current control device structure of a three terminal field effect transistor (FET) device having terminals that comprise source, gate, and drain. In an embodiment, low atom migration metal nitride alloy material layer 108 to III-Nitride material structures or devices may be a current control device structure within a three terminal device field effect transistor device.

Figure 2:
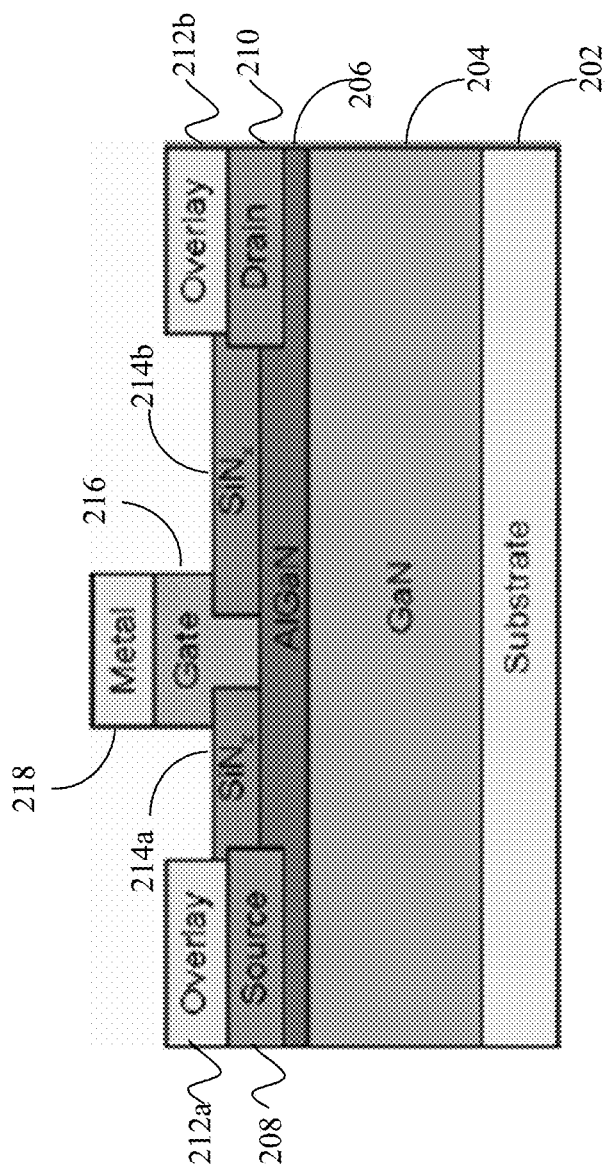
FIG. 2 is a schematic of a three-terminal HEMT device in accordance with an embodiment of the present disclosure.

FIG. 2 is a schematic of a three-terminal HEMT device in accordance with an embodiment of the present disclosure. FIG. 2 includes substrate 202, GaN layer 204, AlGaN layer 206, source 208, drain 210, overlays 212, SiNX layers 214, and a gate/metal stack formed by gate 216 and metal 218. In an embodiment, gate 216 comprises a metal nitride electrode (e.g., TiN). In an embodiment, gate/metal stack 216 and 218 consists of Ni/Au or TiN/Ti/Au or an NCD gate.

In an embodiment, Ni/Au- and TiN-gated HEMTs were fabricated from AlGaN/GaN HEMT structures grown by metal organic chemical vapor deposition (MOCVD) on a SiC substrate, as shown in FIG. 2. In an embodiment, devices had a gate-source spacing of 2 µm, gate length of 3 µm, gate-drain spacing of 10 µm, and gate width of 75 µm.

The HEMT structure consisted of an AlN nucleation layer, Fe-doped GaN buffer layer, AlN interlayer, and an undoped $Al_{0.22}Ga_{0.78}N$ barrier layer, with two-dimensional electron gas (2DEG) carrier density and mobility of $9.4 \times 10^{12}$ cm-2 and 2070 cm2/(V·s) respectively, as indicated by Hall effect measurements.

In an embodiment, mesa isolation was performed using Cl2/Ar-based inductively coupled plasma (ICP) etching. Ohmic metallization was performed by lift-off of electron-beam (e-beam) evaporated Ti/Al/Ni/Au metal, followed by rapid thermal annealing at 850° C. for 30 s in flowing $N_2$. Overlay metallization was deposited by lift-off of e-beam evaporated Ti/Au. The devices were subsequently passivated with plasma-enhanced chemical vapor deposition (PECVD) $SiN_x$, and contact windows were etched using SF6-based reactive ion etching (RIE) conducted with calibration witness $SiN_x$ films to minimize plasma damage to the underlying AlGaN. Ni/Au gates were fabricated on the reference sample by e-beam evaporation and lift-off. TiN gates were fabricated by blanket ALD using tetrakis (dimethylamido) titanium (IV) and N2/H2 plasma at 350° C. for 1000 cycles (approximately 5.5 hour growth time). TiN films produced through this process exhibited decreasing sheet resistivity with increased TiN thickness; as such, 75 nm TiN was deposited to obtain a sheet resistivity, as determined by contactless resistivity measurements. Ti/Au top gate contacts were then fabricated by e-beam deposition and liftoff, and were used as an etch mask for self-aligned $SF_6$-RIE etching to remove the TiN outside the gate regions. Calibration witness samples were again utilized to minimize over-etching the TiN into the underlying $SiN_x$ layer.

As-fabricated HEMTs and corresponding van der Pauw structures were initially tested using standard static I-V measurements to assess device performance and process effects on the HEMT structure itself. Pulsed I-V measurements were also performed to compare dynamic on-resistance ($R_{on,dyn}$) for devices with each gate material; testing was conducted from quiescent drain voltages ($V_{dsq}$) between 0-50 V, with a quiescent gate voltage Vgsq=−6 V, pulse width 500 ns and 1 ms pulse spacing for a duty cycle of 0.05%. Electrical stress stability was conducted through reverse bias sweep, step-stress, and constant bias timed stressing in a normal air atmosphere. Thermal stability was evaluated through sequential device annealing in flowing N2 at temperatures between 400-1000° C. in 100° C. increments for 10 minutes at a time, with device characteristics compared after each anneal.

2.3. Metal Nitride Alloy Composition

In an embodiment, low atom migration metal nitride alloy material layer 108 may be selected from a group comprising titanium nitride, titanium carbon nitride, titanium niobium nitride, titanium aluminum nitride, tantalum nitride, tungsten nitride, niobium nitride, niobium titanium nitride, molybdenum nitride, tantalum nitride ($Ta_3N_5$), zirconium nitride ($Zr_3N_4$), zirconium titanium nitride, hafnium nitride ($Hf_3N_4$), and copper nitride ($Cu_3N$). The low atom migration metal nitride may be a binary metal nitride or a ternary metal nitride alloy material. In some embodiments, the low atom migration metal nitride may be nitrogen rich TiNx with ratio of nitrogen to titanium atoms greater than 1.0.

2.4. Semiconductor Material

The semiconductor may include, but not be limited to, elemental semiconductors, semiconductor alloy material layers, or compound semiconductors. The semiconductor may include, but not be limited to, III-V compound semiconductors or III-Nitride semiconductors. The compound semiconductor may include, but not be limited to, gallium nitride, gallium aluminum nitride, aluminum nitride, gallium aluminum indium nitride, silicon carbide, gallium oxide, or zinc oxide. The elemental semiconductors may include, but not be limited to, silicon or germanium. The semiconductor alloy material layer may include, but not be limited to, silicon germanium.

2.5. High Work Function Metal Nitride Alloy Material Layer

In an embodiment, the composite metal nitride alloy material layer may have a first metal nitride alloy material layer (e.g., a high work function metal nitride alloy material layer) having a first surface and a second surface, with the second surface in direct atomic contact with the semiconductor surface, and a second metal nitride alloy material layer with a first and second surface, with the second surface in direct contact with the first surface of the first metal nitride alloy material layer (e.g., a high work function metal nitride alloy material layer). The second metal nitride alloy material layer may have properties that include, but are not limited to, being a low resistivity metal nitride alloy material layer or being a barrier metal nitride alloy material layer. The barrier metal layer function to reduce the diffusions of atoms from the thick overlay metal through the barrier layer metal into and through the first metal nitride alloy material layer.

In an embodiment, low atom migration metal nitride alloy material layer 108 may have a selected work function within the range of about 3.2 eV to about 5.4 eV. A metal nitride alloy material layer material with high work function is desirable to reduce the reverse bias leakage current of a metal nitride Schottky diode.

Approaches to increase the work function metal nitride alloy material layer material may include, but not be limited to, increasing the nitrogen content in the metal nitride alloy material layer, increasing the carbon content in the metal nitride alloy material layer, increasing the oxygen content in the metal nitride alloy material layer, or combinations therein. For example, increasing both the nitrogen and the carbon content in the metal nitride alloy material or increasing the nitrogen and oxygen in the metal nitride alloy material will increase the work function of the metal nitride alloy material layer.

FIG. 1B is a cross-section of a low atom migration metal nitride alloy material layer diode on III-Nitride material including a high work function metal nitride alloy in accordance with an embodiment of the present disclosure. In FIG. 1B, low atom migration metal nitride alloy material layer 108 includes two layers: high work function metal nitride alloy layer 112 and low migration metal nitride alloy material layer 114.

High work function metal nitride alloy material layer 112 will typically have a work function value in the range of about 4.5 eV to about 5.4 eV. High work function metal nitride alloy material layer 112 may be a binary metal nitride alloy material layer having a nitrogen rich material with a ratio of nitrogen to metal atoms greater than 1.0. In some embodiments, the nitrogen to metal atom ratio is greater than 1.1. In some embodiments, the nitrogen to metal atom ratio is greater than 1.2. High work function metal nitride alloy material layer 202 may also have carbon dopants or oxygen dopants.

High work function metal nitride alloy material layer 112 may also be a ternary metal nitride alloy material layer, such as titanium carbon nitride alloy material layer, tantalum carbon nitride, or titanium oxide nitride. The carbon or oxygen dopants or sufficient high concentration to form a ternary alloy material layer can be incorporated during metal nitride alloy material layer material deposition or can be incorporated by annealing in a carbon based molecule ambient such as methane or an oxygen containing ambient. The oxygen annealing can remove oxygen vacancies and thus increase the work function.

High work function metal nitride alloy material layer 112 may also be a laminated material structure, such a stacked material layer structure of titanium oxide and titanium nitride that can be formed by alternating deposition titanium oxide and titanium nitride in an atomic layer deposition system.

In an embodiment, the work function of high work function metal nitride alloy material layer 112 also varies as a function of thickness of the material layer. The work function of high work function metal nitride alloy material layer 112 increases with increasing thickness of the metal nitride alloy material layer.

High work function metal nitride alloy material layer 112 may be a low atom migration high work function metal nitride alloy material layer. High work function metal nitride alloy material layer 112 may be a low plasma damage or non-energetic high work function metal nitride alloy material layer. Titanium nitride typically has a work function in the range of about 4.2 eV to about 5.2 eV.

Low migration metal nitride alloy material layer 114 may comprise dopant atoms that may include but not be limited to nitrogen, carbon, tantalum, titanium, tungsten or combinations thereof. Low migration metal nitride alloy material layer 114 may also comprise dopant atoms that may include but not be limited to oxygen, platinum, silicon, aluminum, vanadium or combinations therein.

3. STABLE MATERIAL UNDER ELECTRIC FIELD OR THERMAL STRESS

In an embodiment, low atom migration metal nitride alloy material layer 108 may be an enhanced device that includes, but is not limited to, an enhanced high electric field reliable device, an enhanced high temperature reliable device, or combinations thereof. In an embodiment, low atom migration metal nitride alloy material layer 108 is stable under stresses which may include, but not be limited to, electric field stress, thermal stress, radiation stress, or combination therein. In an embodiment, low atom migration metal nitride alloy material layer 108 may be an enhanced high electric field reliable device and/or an enhanced high temperature reliable device. In an embodiment, low atom migration metal nitride alloy material layer 108 may be an enhanced high temperature reliable device or an enhanced high radiation reliable device.

4. NON-PLASMA DAMAGE OR NON-ENERGETIC ION DAMAGE

The semiconductor material can be damaged by energetic ions, energetic electrons, or ultraviolet light that can be present in the environment in the apparatus that is used to deposit the metal nitride alloy material layer. For example, a sputtering deposition approach has energetic ions in the deposition tool environment that impact into the semiconductor material and creates point defects within about 30 nm of the semiconductor surface and surface state traps at the semiconductor surface. Plasma deposition approaches, such as Plasma Enhanced Chemical Vapor deposition, also have energetic ions and ultraviolet wavelengths within the deposition tool environment that impact into the semiconductor material and create point defects within about 30 nm of the semiconductor surface and surface state traps at the semiconductor surface. The additional plasma damage or energetic ion damage point defects within the semiconductor and additional surface state traps can create enhanced leakage current and reduced carrier mobility in a device such as a two-terminal Schottky diode or a three-terminal field effect transistor that is formed in the region near of the semiconductor surface.

Thus, a deposition metal may be selected to have low plasma damage or low energetic ion damage at the surface of the semiconductor. Low atom migration metal nitride alloy material layer 108 may have a low density of displaced atoms (point defects) within the semiconductor within 100 nm of the metal nitride alloy material layer to semiconductor interface (within 100 nm of the semiconductor surface). Deposition methods for the metal nitride alloy material layer that have low plasma damage or low energetic ion damage in the semiconductor include, but may not be limited to, atomic layer deposition, chemical vapor deposition, or metal organic chemical vapor deposition. In addition, additional deposition techniques that have low plasma damage or low energetic ion damage within the semiconductor include remote plasma assisted atomic layer deposition, ozone assisted atomic layer deposition, or plasma assisted atomic layer deposition. Low atom migration metal nitride alloy material layer 108 may be a non-plasma damaged device or a non-energetic ion damaged device or a non-ultraviolet light damage device.

5. LARGE AREA UNIFORM DEPOSITION

Low atom migration metal nitride alloy material layer 108 may have lateral material composition uniformity and material thickness uniformity over the lateral dimension of a substrate surface. For selected deposition methods, the lateral thickness uniformity may be less than 2% thickness non-uniformity over the substrate surface (excluding 2 millimeters from the edge of the substrate). Deposition methods for the metal nitride alloy material layer that have lateral uniform material composition and material thickness uniformity lateral material composition uniformity and material thickness uniformity over the lateral dimension of a substrate surface include, but are not limited to, atomic layer deposition, chemical vapor deposition, metal organic chemical vapor deposition, remote plasma assisted atomic layer deposition, ozone assisted atomic layer deposition, or plasma assisted atomic layer deposition.

6. LARGE AREA ELECTRICALLY UNIFORM CHARACTERISTICS

Low atom migration metal nitride alloy material layer 108 may comprise an electrically uniform interface. Low atom migration metal nitride alloy material layer 108 may comprise an electrically uniform interface across the substrate surface. For selected deposition methods, the forward voltage of a Schottky Diode may have a value that is less than +/−5% forward voltage non-uniformity over the substrate surface (excluding 2 millimeters from the edge of the substrate).

Deposition methods for low atom migration metal nitride alloy material layer 108 that have lateral uniform material composition and material thickness uniformity over the lateral dimension of a substrate surface include, but are not limited to, atomic layer deposition, chemical vapor deposition, metal organic chemical vapor deposition, remote plasma assisted atomic layer deposition, ozone assisted atomic layer deposition, or plasma assisted atomic layer deposition.

7. NON-ALLOY MATERIAL LAYER III-NITRIDE MATERIAL INTERFACE

In an embodiment, low atom migration metal nitride alloy material layer 108 may comprise a non-alloy material layer of the titanium nitride alloy material layer with the III-Nitride at the metal nitride/III-Nitride interface.

TiN and nanocrystalline diamond have been evaluated as potential replacements for conventional Ni-based gate schemes in AlGaN/GaN HEMTs using reverse bias electrical stressing. TiN gates deposited by atomic layer deposition were found to be viable substitutes, as TiN-gated devices exhibited improved on-state characteristics in comparison to the Ni/Au-gated devices. TiN was also determined to have a much higher critical reverse gate voltage (Vgs=−210 V for TiN vs. −120 V for Ni/Au) at which gate degradation occurs. The TiN gates also catastrophically failed at slightly higher and much less variable breakdown voltages than the Ni/Au gates. Stressing at reverse gate biases slightly above the Ni/Au critical voltage but well below the TiN critical voltage (Vgs=−140 V) led to nearly an order of magnitude increase in leakage current for the Ni/Au, but decreased leakage in the TiN.

Nanocrystalline diamond gates exhibited critical voltages of Vgs=−90 V and broke down at much lower reverse bias, possibly due to testing in air without encapsulation to protect the gate material.

8. CONFORMAL MATERIAL DEPOSITION

In an embodiment, low atom migration metal nitride alloy material layer 108 may have a conformal material layer thickness on a three-dimensional substrate surface. For example, FIG. 1C is a cross-section of a low atom migration metal nitride alloy material layer diode including a dielectric 116 and field plate 118 in accordance with an embodiment of the present disclosure.

9. VERTICAL GRADED MATERIAL COMPOSITION AND LAMINATED MATERIAL COMPOSITION

Low atom migration metal nitride alloy material layer 108 to semiconductor device may have a vertically graded composition. FIG. 1D is a cross-section of a low atom migration metal nitride alloy material layer diode including a vertically graded low atom migration metal nitride alloy material layer 120 in accordance with an embodiment of the present disclosure.

In an embodiment, vertically graded low atom migration metal nitride alloy material layer 120 may be formed by a laminate growth process in an atomic layer deposition tool. For example, a metal nitride alloy material layer that would have higher work function is the sequential deposition of a titanium nitride atomic layer and a titanium carbide layer. The percentage of carbon in the film can be varied by selecting the ratio of the number of titanium carbide layers to the number of titanium nitride layers. The can be mixing of the atomic layers after an anneal process. Thus, an alloy such as titanium carbide nitride can be formed by a laminated growth structure. Deposition methods for the metal nitride alloy material layer that may have a graded vertical material composition or laminated material composition include, but are not limited to, atomic layer deposition, remote plasma assisted atomic layer deposition, ozone assisted atomic layer deposition, or plasma assisted atomic layer deposition.

10. EXPERIMENTAL

TiN and nanocrystalline diamond have been evaluated as potential replacements for conventional Ni-based gate schemes in AlGaN/GaN HEMTs using reverse bias electrical stressing. TiN gates deposited by atomic layer deposition were found to be viable substitutes, as TiN-gated devices exhibited improved on-state characteristics in comparison to the Ni/Au-gated devices. TiN was also determined to have a much higher critical reverse gate voltage (Vgs=−210 V for TiN vs. −120 V for Ni/Au) at which gate degradation occurs. The TiN gates also catastrophically failed at slightly higher and much less variable breakdown voltages than the Ni/Au gates.

Stressing at reverse gate biases slightly above the Ni/Au critical voltage but well below the TiN critical voltage (Vgs=−140 V) led to nearly an order of magnitude increase in leakage current for the Ni/Au, but decreased leakage in the TiN. Nanocrystalline diamond gates exhibited critical voltages of Vgs=−90 V and broke down at much lower reverse bias, possibly due to testing in air without encapsulation to protect the gate material.

Devices with Ni/Au, TiN, and p+ diamond gates (e.g., as shown schematically in FIG. 1A) were fabricated from an AlGaN/GaN HEMT structure grown by metal organic chemical vapor deposition (MOCVD) on a SiC substrate, consisting of an AlN nucleation layer, Fe-doped GaN buffer, AlN interlayer, and an undoped $Al_{0.22}Ga_{0.78}N$ barrier layer. Hall effect measurements indicated that the two-dimensional electron gas (2DEG) carrier density and mobility were $9.4 \times 10^{12}$ cm-2 and 2070 cm2/(V·sec), respectively. The devices had a gate-source spacing of 2 μm, a gate length of 3 μm, gate-drain spacing of 10 μm, and gate width of 75 μm. Device mesas were fabricated using Cl2-based inductively coupled plasma (ICP) etching. Ohmic contacts were formed by lift-off and rapid thermal annealing (RTA) of electron-beam (e-beam) evaporated Ti/Al/Ni/Au metal.

After Ohmic contact processing, all devices were passivated with 100 nm plasma-enhanced chemical vapor deposition (PECVD) $SiN_x$. SF6-based reactive ion etching (RIE) was used to open gate and overlay windows in the $SiN_x$. On the reference sample, Ni/Au gates were fabricated by e-beam evaporation and lift-off. TiN-gated HEMTs were fabricated by atomic layer deposition (ALD) of 75 nm TiN, followed by e-beam deposition and lift-off of Ti/Au contacts. The Ti/Au was then used as an etch mask for self-aligned SF6-RIE etching to remove the TiN outside the device gate regions. NCD gates were fabricated by blanket growth of 500 nm boron-doped nanocrystalline diamond by microwave chemical vapor deposition (MW-CVD).

After NCD growth, Ti/Al/Ni/Au gate contacts were fabricated by e-beam deposition and lift-off; the contacts were then used as a self-aligned etch mask for removal of NCD outside the gate regions using an O2-RIE etch. Overlay metal was deposited on all samples by lift-off of e-beam evaporate.

11. RESULTS

11.1. Device Performance

As-fabricated device performance was evaluated via static I-V measurements using a Keithley 4200 III-Nitride Characterization System. FIG. 3 is a table (Table I) showing relevant parameters for each device listed in Table I. The TiN-gated HEMTs offered improved on-state characteristics in the form of higher maximum transconductance (gm,max), higher maximum on-state drain current (Ids,max), and lower on-resistance (Ron) than the Ni/Au-gated HEMTs, albeit at the expense of higher off-state gate and device leakage (Ioff). Hall Effect measurements were also performed on gated van der Pauw patterns fabricated with the devices to characterize the effects of the recess etch and gate deposition processes on the 2DEG density (ns) and carrier mobility (μ2DEG). The decreased 2DEG density and mobility of the Ni/Au devices relative to the as-grown structure was attributed to fluorination of the AlGaN barrier layer during the recess etch. The TiN-gated devices were less degraded, as the structure was effectively annealed during the TiN growth process (350° C. for multiple hours). The on-state performance and Hall characteristics of the NCD-gated HEMTs was worse than expected in comparison to previous results; this could be due to either nonuniform boron doping or damage to the AlGaN barrier during diamond growth.

11.2. Electrical Stressing

Figure 4:
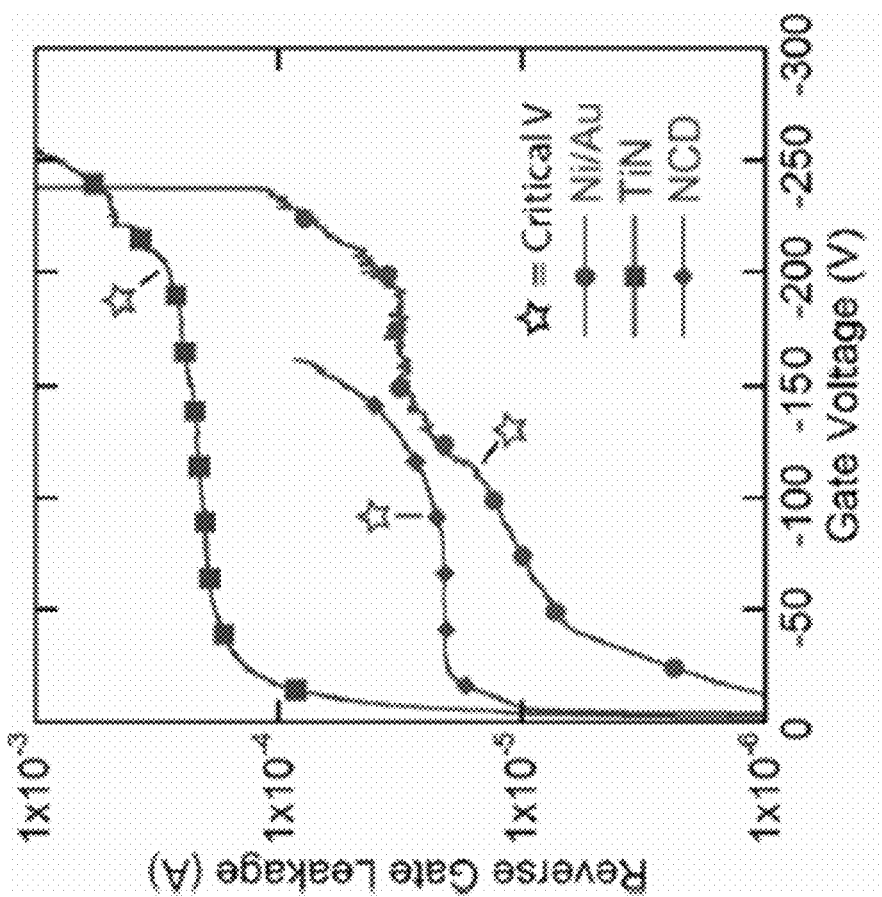
FIG. 4 is a diagram showing gate leakage during gate voltage sweeping from 0V to reverse breakdown for Ni/Au-, TiN-, and NCD-gated HEMTs in accordance with an embodiment of the present disclosure.

All three device schemes were initially tested by reverse bias sweeping from Vgs=0 to breakdown. FIG. 4 is a diagram showing gate leakage during gate voltage sweeping from 0V to reverse breakdown for Ni/Au-, TiN-, and NCD-gated HEMTs. In FIG. 4, critical voltage limits after which gate degradation occurs are marked for each gate scheme.

As shown in FIG. 4, the Ni/Au-gated HEMTs exhibited a critical voltage of Vgs=−120 V, as evidenced by the sudden increase and subsequent instability in gate leakage for higher reverse voltage; this is consistent with previous reports of Ni/Au gate instability under reverse bias stressing. TiN gates were found to exhibit a much higher critical voltage of Vgs=−210 V, albeit with significantly higher overall leakage in comparison to the Ni/Au. This may stem from the lower barrier height at the TiN/AlGaN interface, owing to the lower (and variable) work function of TiN in comparison to Ni/Au, or from the formation of a leaky surface layer at the interface during the initial stages of TiN growth. The NCD-gated HEMT exhibited stable gate current to only Vgs=−90 V; beyond this voltage, the device gate current steadily increased until the gate failed catastrophically at only −160 V. These devices failed as an open gate rather than a short in the case of the previous two devices. It is possible that the gate may have been etched by the ambient atmosphere due to self-heating during reverse bias stressing.

To further assess the breakdown characteristics of the Ni/Au and TiN gates, five HEMTs with each gate scheme were tested to breakdown under step-stress measurements. FIG. 5 is a table (Table II) showing breakdown voltages for Ni/Au- and Ti/N-gated HEMTs. The Ni/Au gates failed catastrophically at varying reverse bias, ranging from −210 V to −270 V, with an average breakdown voltage of approximately −240 V. The TiN failed at a much narrower voltage range (around −270 V), indicating that the TiN gates had both a slightly higher reverse breakdown voltage, as well as a more consistent range of reverse bias failure conditions.

Initial assessments of the time-dependent electrical stress degradation were made by holding devices at a constant gate bias of −140 V for 1 hour (Vds=0). This bias was selected to evaluate the stability of each gate scheme at a condition above the critical voltage that should initiate degradation (but not failure) in the reference Ni/Au devices.

Figure 6:
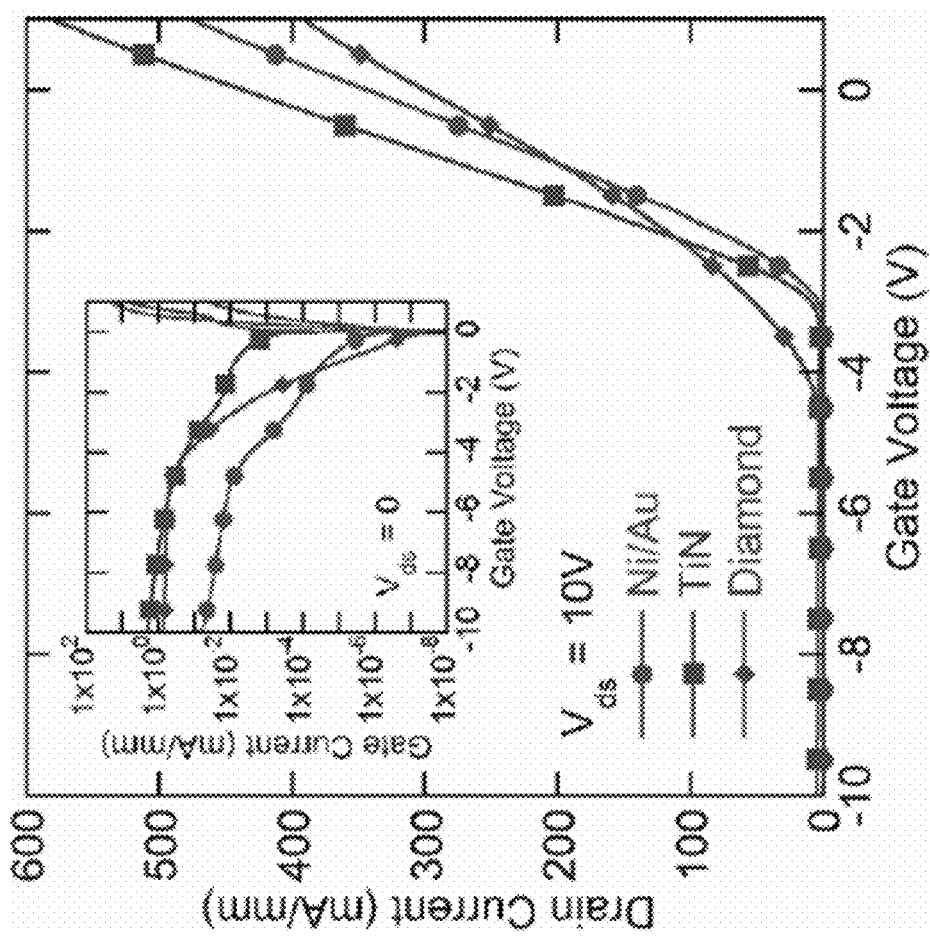
FIG. 6 is a diagram showing turn-on (Ids-Vgs) characteristics at Vds=10V for HEMT devices with Ni/Au, TiN, and NCD gates in accordance with an embodiment of the present disclosure.

Gate stability was evaluated by observing the gate current during stressing. FIG. 6 is a diagram showing turn-on (Ids-Vgs) characteristics at Vds=10V for HEMT devices with Ni/Au, TiN, and NCD gates.

Changes in the gate I-V characteristics before and after stressing were also evaluated. During this stress, the Ni/Au gate leakage at increased by nearly 225% without device failure, indicating that the gate degraded under these conditions. TiN gate leakage actually decreased to a stable value during stressing, possibly due to a self-annealing effect in the TiN during stressing. The NCD gate failed almost immediately under these conditions; this was expected given that the stress condition was significantly beyond the critical voltage identified in FIG. 4.

Comparison of the pre- and post-stress gate current confirmed that permanent degradation occurred in the Ni/Au gate after stressing above the critical voltage, as the gate leakage increased by nearly an order of magnitude after stressing. Conversely, the TiN leakage decreased as a result of the stressing, since the selected stress condition was well below the observed critical voltage for TiN. The decrease during stressing also suggests that the TiN leakage may be further reduced by annealing the gate films before testing.

Ni/Au-, TiN-, and NCD-gated HEMTs were successfully fabricated and characterized under static I-V testing. Stressing of the device gates under high reverse bias identified critical voltage conditions that led to degradation and catastrophic failure. Ni/Au gates exhibited a critical voltage around Vgs=−120 V, and failed catastrophically at voltages between −210 V to −270 V. TiN gates exhibited a significantly higher critical voltage of −210 V, along with much more consistent breakdown voltages around −270 V. NCD-gated HEMTs exhibited lower critical voltages of −90 V and breakdown voltages around −160 V, possibly due to gate degradation during high bias testing in the ambient atmosphere. Stressing at Vgs=−140 V (above the Ni/Au critical voltage) for one hour led to permanent degradation in the Ni/Au gates, as evidenced by higher leakage currents during and after stressing. The TiN gates improved as a result of this stress condition (below the TiN critical voltage), while the NCD gates failed almost immediately due to stressing well above their critical voltage. TiN gates are therefore expected to be more stable under high reverse bias conditions than the Ni/Au or unencapsulated NCD gates.

Figure 7:
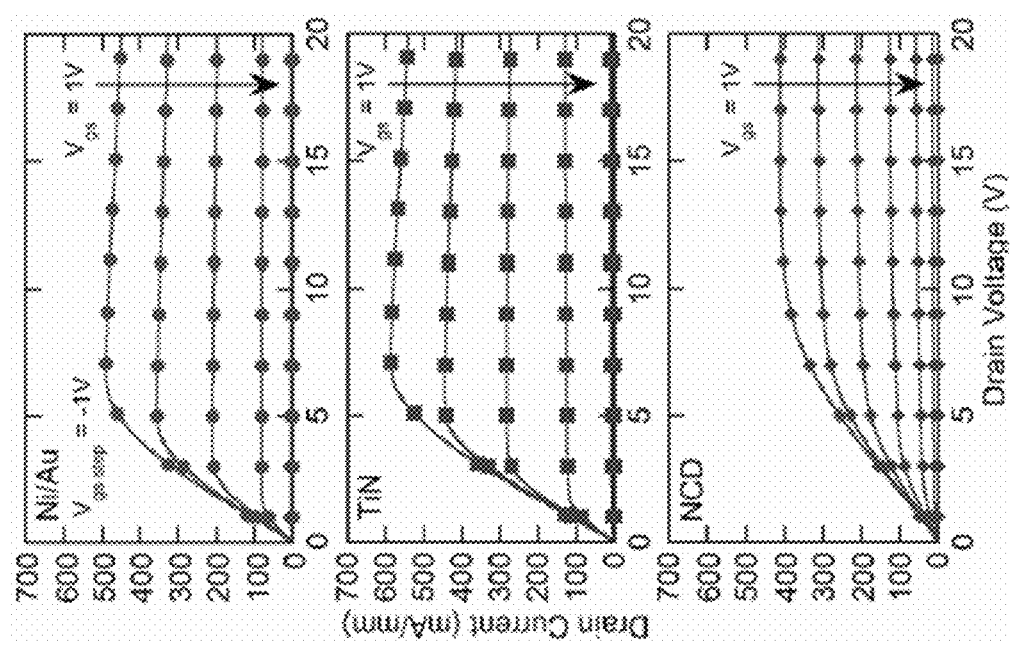
FIG. 7 is a diagram showing static drain current-drain voltage (Ids-Vds) behavior for Ni/Au, TiN, and NCD-gated HEMTs in accordance with an embodiment of the present disclosure.
Figure 8:
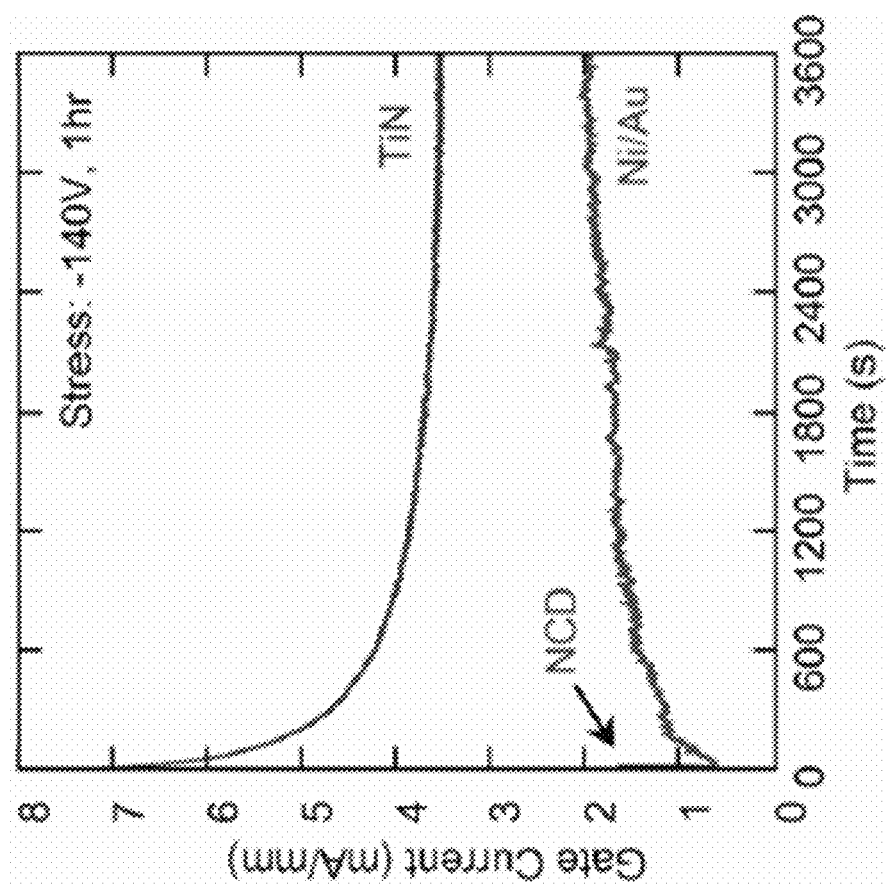
FIG. 8 is a diagram showing Ni/Au, TiN, and NCD gate during stressing at Vgs=−140 V for 1 hour in accordance with an embodiment of the present disclosure.
Figure 9:
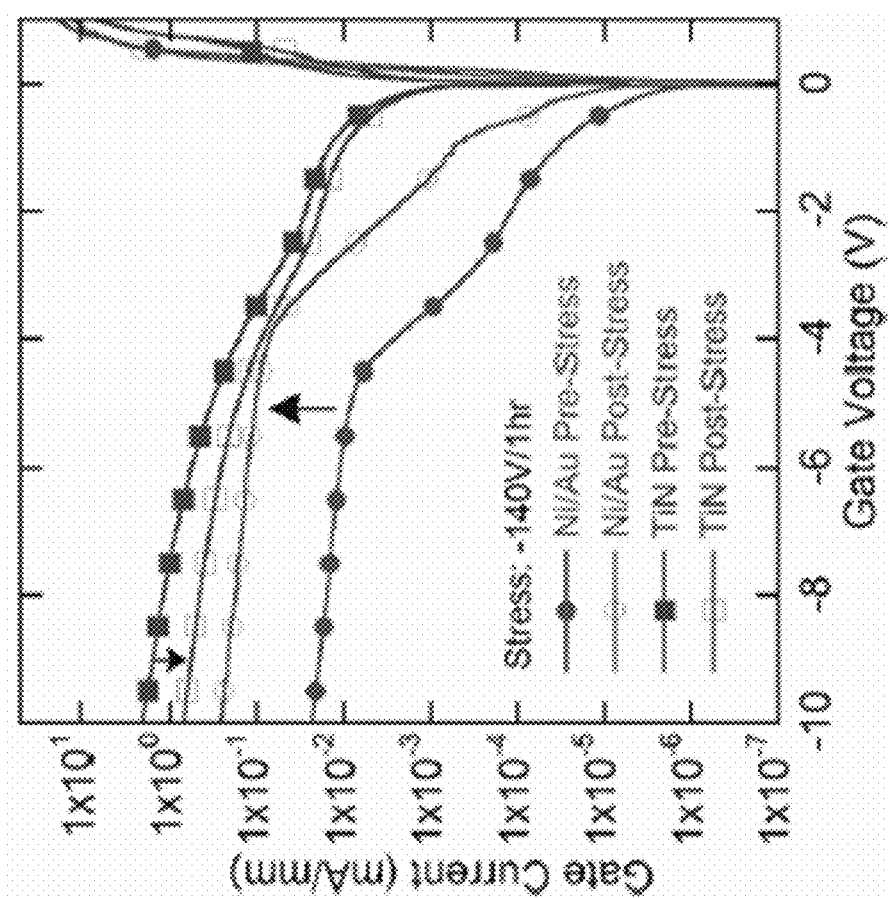
FIG. 9 is a diagram showing Ni/Au and TiN gate leakage currents before and after stressing at Vgs=−140 V for 1 hour in accordance with an embodiment of the present disclosure.

FIG. 7 is a diagram showing static drain current-drain voltage (Ids-Vds) behavior for Ni/Au, TiN, and NCD-gated HEMTs. (Vgs ranged from −10 V to 1 V in 1 V steps.) FIG. 8 is a diagram showing Ni/Au, TiN, and NCD gate during stressing at Vgs=−140 V for 1 hour (NCD gate failed within 60 sec of stress initiation). FIG. 9 is a diagram showing Ni/Au and TiN gate leakage currents before and after stressing at Vgs=−140 V for 1 hour. The Ni/Au gate leakage increased by nearly one order of magnitude after stressing, while the TiN leakage decreased.

12. METHODS

Methods in accordance with embodiments of the present disclosure include methods wherein low atom migration metal nitride alloy material layer 108 can be deposited by a non-plasma process metal which may include, but not be limited to, atomic layer deposition, metal organic chemical vapor deposition, chemical vapor deposition, or molecular beam deposition. Methods in accordance with embodiments of the present disclosure include methods wherein low atom migration metal nitride alloy material layer 108 can be deposited by a low-plasma process metal which may include, but not be limited to, plasma assisted atomic layer deposition, metal organic chemical vapor deposition, chemical vapor deposition, or molecular beam deposition. Methods in accordance with embodiments of the present disclosure include methods wherein low atom migration metal nitride alloy material layer 108 can be deposited by a remote-plasma process metal which may include, but not be limited to, remote plasma assisted atomic layer deposition, metal organic chemical vapor deposition, chemical vapor deposition, or molecular beam deposition.

In accordance with embodiments of the present disclosure, low atom migration metal nitride alloy material layer 108 can be deposited by methods that include, but are not limited to, atomic layer deposition, plasma assisted atomic layer deposition, or remote plasma assisted atomic layer deposition. Low atom migration metal nitride alloy material layer 108 can be annealed at a selected temperature and selected ambient. Low atom migration metal nitride alloy material layer 108 can be deposited in-situ with a semiconductor material growth system such as a III-Nitride alloy material growth system, III-V material growth system, or gallium oxide system, for example.

Figure 10:
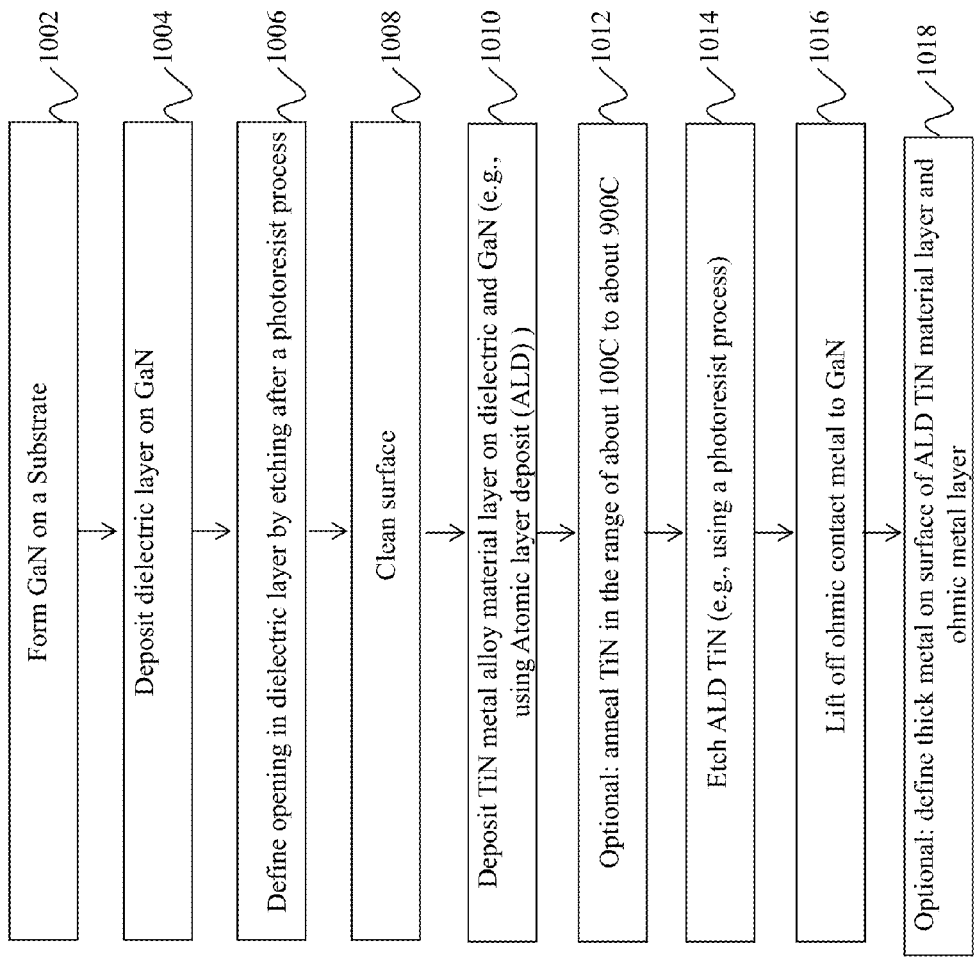
FIG. 10 is a flowchart of a method for creating a semiconductor device in accordance with an embodiment of the present disclosure.

FIG. 10 is a flowchart of a method for creating a semiconductor device in accordance with an embodiment of the present disclosure. In step 1002, GaN is formed on a substrate. For example, in an embodiment, a GaN layer is formed on Sapphire with an N+ subdiffusion layer or GaN N-epi on a N+ Substrate. In step 1004, a dielectric layer (such as sputtered AlN, MOCVD grown AlN, CVD deposited $SiO_2$, PECVD $SiO_2$, or ALD $Al_2O_3$) is deposited on the GaN. In step 1006, an opening is defined in the dielectric layer by etching after a photoresist process. In step 1008, the surface is cleaned.

In step 1010, a low atom migration metal nitride alloy material layer (e.g., a TiN metal alloy material layer) is deposited (e.g., using an atomic layer deposit (ALD) technique) on the dielectric and the GaN. In optional step 1012, the low atom migration metal nitride alloy material layer (e.g., the TiN metal alloy material later) can be annealed (e.g., in the range of 100 C to 900 C). In step 1014, the TiN metal alloy material layer is etched (e.g., using a photoresist process). In step 1016, the ohmic contact metal to GaN is lifted off. In optional step 1018, thick metal on the surface of the ALD TiN material layer and ohmic metal layer is defined.

13. CONCLUSION

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A semiconductor device, comprising:
   a semiconductor layer;
   a high work function transition metal nitride alloy material layer having a first surface and a second surface, wherein the first surface is coupled to the semiconductor layer; and
   a low atom migration transition metal nitride alloy material layer coupled to the second surface of the high work function transition metal nitride alloy material layer, wherein the low atom migration transition metal nitride alloy material layer is in direct atomic contact with the second surface of the high work function transition metal nitride alloy material layer.

2. The semiconductor device of claim 1, wherein the low atom migration transition metal nitride alloy material layer is formed from titanium nitride (TiN).

3. The semiconductor device of claim 1, wherein contact between the semiconductor layer and the low atom migration transition metal nitride alloy material layer forms a Schottky diode.

4. The semiconductor device of claim 3, wherein the Schottky diode comprises a TiN gate on an AlGaN/GaN high electron mobility transistor (HEMT).

5. The semiconductor device of claim 1, wherein the semiconductor layer comprises III-Nitride material.

6. The semiconductor device of claim 5, wherein first atoms in the low atom migration transition metal nitride alloy material layer have low migration into the III-Nitride material, and wherein second atoms in the III-Nitride material have low migration into the low atom migration transition metal nitride alloy material layer.

7. The semiconductor device of claim 1, wherein the low atom migration transition metal nitride alloy material layer comprises:
   a tunneling material layer at an interface between the low atom migration transition metal nitride alloy material layer and the semiconductor layer.

8. The semiconductor device of claim 5, wherein the low atom migration transition metal nitride alloy material layer has a vertically graded composition.

9. The semiconductor device of claim 1, wherein the low atom migration transition metal nitride alloy material layer is configured to reduce diffusions of atoms from an overlay metal layer through the low atom migration transition metal nitride alloy material layer into and through the high work function transition metal nitride alloy material layer.

10. The semiconductor device of claim 1, wherein the high work function metal nitride alloy material layer has a ratio of nitrogen to metal atoms greater than 1.0.

11. The semiconductor device of claim 1, wherein the high work function metal nitride alloy material layer has carbon dopants.

12. The semiconductor device of claim 1, wherein the high work function metal nitride alloy material layer has oxygen dopants.

13. The semiconductor device of claim 1, wherein the high work function metal nitride alloy material layer has carbon or oxygen dopants sufficient to form a ternary alloy material layer.

14. The semiconductor device of claim 1, wherein the low atom migration transition metal nitride alloy material layer is a low resistivity transition metal nitride alloy material layer.

15. The semiconductor device of claim 1, wherein the low atom migration transition metal nitride alloy material layer is a barrier transition metal nitride alloy material layer.

16. A Schottky diode, comprising:
   a semiconductor layer;
   a high work function transition metal nitride alloy material layer having a first surface and a second surface, wherein the first surface is coupled to the semiconductor layer; and
   a low atom migration transition metal nitride alloy material layer coupled to the second surface of the high work function transition metal nitride alloy material layer, wherein the low atom migration transition metal nitride alloy material layer is in direct atomic contact with the second surface of the high work function transition metal nitride alloy material layer.

17. The Schottky diode of claim 16, wherein the low atom migration transition metal nitride alloy material layer is formed from titanium nitride (TiN).

18. The Schottky diode of claim 16, wherein first atoms in the low atom migration transition metal nitride alloy material layer have low migration into III-Nitride material of the semiconductor layer, and wherein second atoms in the III-Nitride material have low migration into the low atom migration transition metal nitride alloy material layer.

19. The Schottky diode of claim 16, wherein the low atom migration transition metal nitride alloy material layer has a vertically graded composition.

20. A semiconductor device, comprising:
   a semiconductor layer;
   a high work function material layer having a first surface and a second surface, wherein the first surface is coupled to the semiconductor layer, and wherein the high work function material layer has carbon or oxygen dopants; and
   a transition metal nitride alloy material layer coupled to the second surface of the high work function transition metal nitride alloy material layer, wherein the transition metal nitride alloy material layer is in direct atomic contact with the second surface of the high work function material layer.

* * * * *